United States Patent [19]

Oppawsky et al.

[11] Patent Number: 6,057,004
[45] Date of Patent: May 2, 2000

[54] METHOD OF TREATING SURFACES

[75] Inventors: Steffen Oppawsky, Bad Homburg; Dieter Schödel, Wiesbaden; Hans-Jürgen Tiller, Jena, all of Germany

[73] Assignee: Heraeus Kulzer GmbH, Hanau, Germany

[21] Appl. No.: 09/036,118

[22] Filed: Mar. 6, 1998

[30] Foreign Application Priority Data

Mar. 11, 1997 [DE] Germany ............................ 197 09 673

[51] Int. Cl.[7] ........................................................ B05D 3/06
[52] U.S. Cl. .......................... 427/535; 427/536; 427/539; 427/559; 427/489; 427/491; 427/509; 427/2.29
[58] Field of Search ........................................ 427/536, 539, 427/491, 535, 559, 2.29, 509, 489, 372.2

[56] References Cited

U.S. PATENT DOCUMENTS

| | | | |
|---|---|---|---|
| 5,294,464 | 3/1994 | Geilsler et al. | 427/489 |
| 5,487,920 | 1/1996 | Lopata et al. | 427/489 |
| 5,527,629 | 6/1996 | Gastiger et al. | 428/688 |
| 5,552,226 | 9/1996 | Thurm et al. | 428/412 |
| 5,591,140 | 1/1997 | Narayanan et al. | 604/269 |
| 5,645,882 | 7/1997 | Llanos | 427/2.24 |

FOREIGN PATENT DOCUMENTS

| | | | |
|---|---|---|---|
| 249849 A1 | 9/1987 | German Dem. Rep. | A61C 13/00 |
| 4204082 A1 | 8/1993 | Germany | B05D 3/10 |
| 4225106 C2 | 2/1994 | Germany | A61C 13/02 |

*Primary Examiner*—Roy V. King
*Attorney, Agent, or Firm*—Norris, McLaughlin & Marcus, P.A.

[57] ABSTRACT

The invention concerns a method of treating surfaces and surface-adjacent layers of dental components in particular. A series of several different plasma treatments produces high adhesion between the plasma-treated surface and a layer of plastic applied thereto. The invention also concerns a method of sealing the surface of work by treating it with plasma and covering it with a layer that contains silicate.

24 Claims, No Drawings

METHOD OF TREATING SURFACES

The present invention concerns a method of treating the surfaces and surface-adjacent layers of work, especially dental components, with a gas plasma, whereby the work is exposed to the plasma, the plasma firmly attaches the constituents of the gas to the surface and plastic is then applied to the surface. The invention further concerns a method of treating the surfaces of work, especially a dental component, with a gas plasma, whereby the work is exposed to the plasma, and the plasma firmly attaches the constituents of the gas to the surface.

BACKGROUND OF THE INVENTION

A method of this genus is known from DDR Patent 212 573. This patent describes exposing metal surfaces to a plasma that contains a silane. An adhesion-promoting coat accordingly forms on the surface and provides a secure but resilient attachment between the surface and a plastic applied thereto. Experience demonstrates, however, that this method does not always ensure adequate strength. The method also requires a strictly metal surface as a base, and existing structures of both metal and plastic whereby the plastic is chipped for example cannot be satisfactorily repaired. Applying known adhesion-promoting coats of this type to a metal framework by flame pyrolysis is also known. This approach heats the metal up very high, which can lead to undesired thermal failure. Furthermore, flame pyrolysis cannot be employed to repair surfaces that are at least partly of plastic.

Cleaning metal surfaces with a plasma is known from U.S. Pat. No. 5,188,800. German Patent 3 316 742 discloses both a method of cleaning metal surfaces with plasma and method of coating them with titanium.

The object of the present invention is an improved method of treatment with plasma in accordance with the prior art hereintofore discussed wherein the surface of the work can be provided with a reliably adherent coat that contains silane.

SUMMARY OF THE INVENTION

This object is attained in accordance with the present invention in the method recited in the preamble to claim 1 in that the surface is exposed, first, to a plasma of a gas that contains air, oxygen, steam, and/or an inert gas, next, to a plasma of a gas that an organic silicon compound has been added to, whereby a coat that contains silicate forms on the surface of the work, and, finally, to a plasma of a gas that essentially contains air, oxygen, steam, and/or an inert gas. Activation of the surface of the work is accordingly followed by what is called silanization, by the application of the silicate-containing coat, and then by re-activation. The work is then subject to conventional treatment, meaning that it is coated with plastic. The sequence in accordance with the present invention results in outstanding adhesion between the work and the plastic applied thereto. Metal dental-prosthesis frameworks can for example be faced with plastic, and very firm adhesion created between the metal surface and the plastic. The same method can be employed to treat plastic surfaces or surfaces comprising both metal and plastic areas, to repair dental prostheses and individual teeth for example. Plastic surfaces can be treated because they remain at a relatively low temperature (approximately 100° C.) while exposed to the plasma.

DETAILED DESCRIPTION

It is practical for the treatment with plasma to be conducted in a vacuum of 0.01 to 10 and especially of 0.1 to 5 mbars.

Exposure to the any of the combinations of gases, during each of the three steps of the method, that is, can last 10 to 300 and especially 20 to 60 seconds, whereby the power density of the surface being treated can range from 2 to 5000 and especially from 1000 to 4000 mW/cm$^2$.

It turns out to be particularly advantageous for the organic silicon compound to be added at 0.01 to 50 and especially 0.1 to 30% molar of the total gas.

The organic silicon compound can for example be tetraethoxysilane, tetramethyl silane, tetramethoxy silane or hexamethyl disiloxane.

It can also be of advantage for the plasma to be generated either by alternating-current discharge at a frequency of 10 Hz to 60 kHz and especially of 30 Hz to 20 kHz or by microwave discharge.

It can also be practical for the work to be exposed after being treated with the plasma to a pressure of 0.01 to 1 mbar for 10 to 300 seconds and/or to a temperature of 50 to 120° C. for 20 to 60 seconds.

The pressure and/or vacuum treatments make it possible to eliminate the need to produce a dispersion coat on a dental plastic during photocuring. Although such coats are desirable while a coat is being built up on a dental plastic, they are detrimental to sealing the surface. The need for a dispersion coat can also be eliminated by flooding the processing chamber (wherein the method is being conducted) containing the plastic-covered work with an inert gas, nitrogen for example and irradiating the work simultaneously or subsequently.

The object is attained in a method of treating the surfaces of work, especially a dental component, with a gas plasma, whereby the work is exposed to the plasma, and the plasma firmly attaches the constituents of the gas to the surface, in that the surface of the work is of plastic or ceramic, in that the gas contains air, oxygen, steam, and/or an inert gas along with an organic silicon compound, and in that the surface of the work is at least to some extent covered with an in-itself continuous coat containing silicate. This version of the method is especially appropriate for sealing surfaces. The quality, especially the hardness, resistance to abrasion, solubility, etc. of plastic surfaces, especially the faces of dental prostheses, can be essentially improved by such a coat.

For this purpose it is practical for the organic silicon compound to be added at 20 to 90 and especially 30 to 80% molar of the total gas.

It is also of advantage in order to ensure ideal surface protection for the silicate-containing coat to be 0.1 to 5 and especially 0.3 to 3 $\mu$m thick.

Further practical embodiments of this version of the invention are recited in the subsidiary claims.

The object is also attained in a method of treating work, especially dental components, with plasma from a gas, whereby the work is exposed to the plasma, in that the work is coated with a photopolymerizable plastic, especially a dental plastic, in that the gas contains air, oxygen, steam, and/or an inert gas, and in that the coating is cured by the actions of the plasma and of irradiation.

It is practical for the plasma and irradiation to take effect sequentially.

It is of particular advantage to the curing process for the irradiation to be carried out with ultraviolet light.

This procedure can follow one of the treatments recited in claims 1 and 10. The plasma activates the surface of the plastic, improving the adhesion of any plastic coat applied later thereto.

Further practical embodiments of this version of the invention are recited in the other subsidiary claims.

The present invention will now be specified with reference to examples.

Examples 1 through 4 concern applying plastic to various dental alloys. Their tensile shear strength was measured as a function of boiling time. The results obtained with the method in accordance with the present invention were compared with those of a state-of-the-art individual. Table 1 shows the results. Example 1 relates to a coat produced on the dental alloy Maingold SG, Example 2 to one produced on Heraenium CEA, Example 3 to one produced on Albabond E, and Example 4 to one produced on Hera GG (all products of Heraeus Kulzer GmbH). All four tests were conducted as will now be specified.

The plasma was ignited at a pressure of 2 mbars. The electrical parameters were 50 mA, 600 V, and 30 W. The work had an area of 8 cm$^2$. Output per area was 3.75 W/cm$^2$. The alloy was treated with the aforesaid tetramethoxysilane (TMOS) plasma for 60 seconds in accordance with the known method and in accordance with the present invention with air plasma for 20 seconds, with the TMOS plasm for 60 seconds, and finally with air plasma for another 20 seconds. A primer (Heraeus Kulzer Siliseal) was then applied with an artist's brush to the resulting coat of silicon dioxide followed by an opaquer (Heraeus Kulzer Artglass-Opaker), and the work was polymerized for 90 seconds with ultraviolet light. Dentine was then twice applied and polymerized for 90 seconds. More dentine was applied and polymerized with ultraviolet light for 180 seconds. The plastic was 3 mm thick overall. Tensile shear strength was measured in accordance with DIN 53 286.

As will be evident from Table 1, the tensile shear strengths of the coats treated in accordance with the present invention were substantially higher than those attainable at the state of the art.

Examples 5 and 6 relate to sealing the surface of dental components. The finished work was boiled for 24 hours and the tensile shear strength of the sealing coat measured. Table 2 shows the results. The results obtained in both cases for work sealed in accordance with the present invention were compared with those obtained without sealing.

Example 5 relates to a layer applied to Hera GG primed with brushed-on Siliseal followed by Artglass-Opaker polymerized for 90 seconds with ultraviolet light, subsequent to which dentin was twice applied and polymerized for 90 seconds, followed by more dentin polymerized for 180 seconds with ultraviolet light. The overall coat was 3 mm thick.

Example 6 relates to a method similar to the one employed in Example 5, except that, before the primer was applied, the alloy was treated with plasma as in the methods in accordance with the present invention employed in Examples. The tensile shear strength of the non-sealed composite of Example 6 was higher than that of the corresponding material of Example 5.

How the surface of the built-up material was sealed in the methods of Examples 5 and 6 will now be specified. The plasma was ignited at a pressure of 2 mbars. The electrical parameters were 50 mA, 600 V, and 30 W. The work had an area of 8 cm$^2$. The precise output per area of a coating applied to a layer of plastic is difficult to determine, although it is lower that of a coating on metal at the same electrical parameters. In the present case the output per area was approximately 1.88 W/cm$^2$. The plasma was a mixture of silane, air, and 70 to 90% molar TMOS. Exposure time can be varied more or less as desired, essentially dictating the thickness of the sealing coat. The coat grew at 1 μm a minute. In the present case the coating (treatment) took 120 seconds. The resulting sealing coat is 2 μm thick. Tensile shear strength was measured in accordance with DIN 53 286.

In both examples, the tensile shear strength of the layer sealed with the plasma containing TMOS in accordance with the present invention is higher than that of the non-sealed layer. The sealing coat accordingly acts as a barrier to permeation from outside. It also exhibits an opposite action, at least extensively preventing the constituents of the plastic from escaping. The empirically derived tensile shear strengths accordingly allow indirect conclusions as to the effectiveness of the sealing coat.

TABLE 1

Tensile shear strength in MPa as a function of boiling time

| Plasma and exposure time, seconds | Boiling time, hours | | | | |
|---|---|---|---|---|---|
| | 0 | 1 | 8 | 24 | 48 |
| Example 1 | | | | | |
| TMOS (60) | 17.27 | 14.64 | 7.64 | 4.65 | 2.13 |
| Air (20), TMOS (60), air (20) | 25.64 | 36.26 | 19.94 | 16.42 | 10.53 |
| Example 2 | | | | | |
| TMOS (60) | 28.60 | 20.60 | 15.00 | 12.00 | 8.70 |
| Air (20), TMOS (60), air (20) | 25.00 | 40.78 | 34.98 | 29.03 | 23.53 |
| Example 3 | | | | | |
| TMOS (60) | 15.88 | 12.20 | 7.40 | 4.65 | 2.13 |
| Air (20), TMOS (60), air (20) | 21.22 | 21.60 | 15.04 | 11.75 | 9.70 |
| Example 4 | | | | | |
| TMOS (60) | 25.79 | 16.74 | 10.30 | 8.20 | 4.60 |
| Air (20), TMOS (60), air (20) | 28.86 | 25.79 | 16.74 | 16.71 | 15.00 |

TABLE 2

Tensile shear strength in MPa after 24 hours boiling

| Surface treatment | Strength |
|---|---|
| Example 5 | |
| No seal | 3.00 |
| Sealed with TMOS | 10.00 |
| Example 6 | |
| No seal | 8.48 |
| Sealed with TMOS | 11.64 |

We claim:

1. Method of treating the surfaces and surface-adjacent layers of article with a gas plasma, whereby the article is exposed to the plasma, to attach the constituents of the gas to the surface, and plastic is then applied to the surface, wherein the surface is exposed, first, to a plasma of a gas that contains air, oxygen, steam, an inert gas or a combination thereof; next, to a plasma of a gas comprising an organic silicon compound, whereby a silicate-containing coating forms on the surface of the article, and, finally, to a plasma of a gas that essentially contains air, oxygen, steam, an inert gas or a combination thereof.

2. Method as in claim 1, wherein the treatment with plasma is conducted in a vacuum of 0.01 to 10 mbars.

3. Method as in claim 1, wherein exposure to any of the combinations of the gases lasts 10 to 300 seconds, and wherein the power density of the surface being treated ranges from 2 to 5000 mW/cm$^2$.

4. Method as in claim 1, wherein the organic silicon compound is added at 0.01 to 50% molar of the total gas.

5. Method as in claim 1, wherein the organic silicon compound is tetraethoxysilane, tetramethyl silane, tetramethoxy silane or hexamethyl disiloxane.

6. Method as in claim 1, wherein the plasma is generated either by alternating-current discharge at a frequency of 10 Hz to 60 kHz or by microwave discharge.

7. Method as in claim 1, wherein the article is exposed, after being treated with the plasma, to a pressure of 0.01 to 1 mbar for 10 to 300 seconds, to a temperature of 50 to 120° C. for 20 to 60 seconds or both.

8. Method of claim 1, wherein said surfaces are metal surfaces.

9. Method of claim 1, wherein said surfaces are plastic surfaces.

10. Method of treating the surface of article with a gas plasma, whereby the article is exposed to the plasma to attach the constituents of the gas to the surface, wherein the surface of the article is of plastic or ceramic, the gas contains air, oxygen, steam, an inert gas or a combination thereof along with an organic silicon compound, and the surface of the article is at least partially covered with a coating which contains silicate.

11. Method as in claim 10, wherein the treatment with plasma is conducted in a vacuum of 0.01 to 10 mbars.

12. Method as in claim 10, wherein the organic silicon compound is added at 20 to 90% molar of the total gas.

13. Method as on claim 10, wherein the organic silicon compound is tetraethoxysilane, tetramethyl silane, tetramethoxy silane, or hexamethyl disiloxane.

14. Method as in claim 10, wherein the silicate-containing coat is 0.1 to 5 µm thick.

15. Method as in claim 10, wherein the coating takes 10 to 300 seconds, and the power density of the surface being treated ranges from 2 to 5000 mW/cm$^2$.

16. Method as in claim 10, wherein the plasma is generated either by alternating-current discharge at a frequency of 10 Hz to 60 kHz or by microwave discharge.

17. Method as in claim 10 wherein the article is exposed, after being treated with the plasma, to a pressure of 0.01 to 1 mbar for 10 to 300 seconds, to a temperature of 50 to 120° C. for 20 to 60 seconds or both.

18. Method of treating article whereby the article is treated with plasma from a gas, wherein the article is exposed to the plasma, and the article is coated with a photopolymerizable plastic, the gas contains air, oxygen, steam, an inert gas, or a combination thereof and the coating is cured by the actions of the plasma and of irradiation.

19. Method as in claim 18, wherein the plasma and irradiation take effect sequentially.

20. Method as in claim 18, wherein the irradiation is carried out with ultraviolet light.

21. Method as in claim 18, wherein the plastic-covered article is washed with an inert gas, and irradiated simultaneously or subsequently.

22. Method as in claim 18, wherein the treatment with plasma is conducted in a vacuum of 0.01 to 10 mbars.

23. Method as in claim 18, wherein the coating takes 10 to 300 seconds, the power density of the surface being treated ranges from 2 to 5000 mW/cm$^2$, and the coating takes place at a pressure of 0.01 to 10 mbars.

24. Method as in claim 18, wherein the plasma is generated either by alternating-current discharge at a frequency of 10 Hz to 60 kHz or by microwave discharge.

* * * * *